United States Patent
Dodabalapur et al.

(10) Patent No.: US 6,363,096 B1
(45) Date of Patent: Mar. 26, 2002

(54) ARTICLE COMPRISING A PLASTIC LASER

(75) Inventors: Ananth Dodabalapur, Millington, NJ (US); Attila Mekis, Cambridge, MA (US); John A. Rogers, New Providence; Richart Elliott Slusher, Lebanon, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/385,167

(22) Filed: Aug. 30, 1999

(51) Int. Cl.[7] .............................................. H01S 3/0933
(52) U.S. Cl. .............................. 372/75; 372/69; 372/70; 385/31; 385/43; 385/146
(58) Field of Search ........................... 372/45, 46, 50, 372/96, 75, 70, 107; 385/43, 146, 31

(56) References Cited

U.S. PATENT DOCUMENTS

| | | | | |
|---|---|---|---|---|
| 3,779,628 A | * | 12/1973 | Kapron et al. | |
| 4,553,238 A | * | 11/1985 | Shaw et al. | |
| 5,457,707 A | * | 10/1995 | Sobey et al. | |
| RE35,215 E | * | 4/1996 | Waarts et al. | |
| 5,881,089 A | * | 3/1999 | Berggren et al. | |
| 5,999,308 A | * | 12/1999 | Nelson et al. | |

OTHER PUBLICATIONS

Dodabalapur, A., et al., Physics and applications of organic microcavity light emitting diodes, Dec. 1996, Journal of Applied Physics, vol. 80, No. 12, pp. 6954–6963.*

* cited by examiner

*Primary Examiner*—James W. Davie
*Assistant Examiner*—Cornelius H. Jackson
(74) *Attorney, Agent, or Firm*—Lowenstein Sandler PC

(57) ABSTRACT

A laser structure may be used to fabricate a plastic laser and achieve electrically-driven lasing action. The structure comprises an LED, a waveguide laser, and a substrate disposed between them. The substrate has a first and a second side. Light emitted from the LED is received by the substrate at the first side and concentrated as it is guided with the body of the substrate to the second side, where it is received by the laser. Concentration of the light across the substrate improves the efficiency of the device and leads to lower threshold powers.

18 Claims, 2 Drawing Sheets

ARTICLE COMPRISING A PLASTIC LASER

FIELD OF THE INVENTION

The present invention relates to a laser structure for fabricating a plastic laser and achieving electrically-driven lasing action.

BACKGROUND OF THE INVENTION

A number of conventional solid state lasers are based on inorganic semiconductors (e.g., GaAs), and typically are electrically-driven. These lasers use a recombination of injected electrons and holes in a laser cavity. Optical and electrical requirements for these lasers are easily met as the inorganic materials exhibit high carrier mobility and provide large refractive index changes with use of closely-related materials.

Semiconductor lasers using organic or polymeric materials and electrically-driven laser action have recently attracted a great deal of interest. Organic solid-state lasers have the potential to provide a compact low-cost laser source over a broad range of wavelengths throughout the visible spectrum. Organic lasers also influence research in other areas and have led to advances with both organic and inorganic semiconductor lasers, as described in A. Dodabalapur et al., "Organic Solid-State Lasers: Past and Future," SCIENCE Vol. 277 (Sep. 19, 1997), at pp. 1787–788, incorporated herein. Examples include the successful realization of distributed feedback (DFB) and distributed Bragg reflector (DBR) lasers with dye-doped polymers and the widespread use of IDP-based DFB and DBR lasers. Such lasers exhibit superior single frequency operation and high-speed modulation characteristics, e.g., as compared with Fabry-Perot lasers.

The prospect of realizing electrically-driven laser action with organic or polymeric semiconductors arises from two principal sources: (i) the high degree of success achieved in improving the quantum efficiency and operating lifetime of light-emitting diodes (LEDs), and (ii) the relatively low threshold for photopumped laser action in some classes of organic or polymeric semiconductors. These conditions are required, but not sufficient, to provide an efficient organic laser. There are many problems, for example, with conventional diode structures (which form the basis for nearly all inorganic semiconductors) when applied to organic semiconductors. One problem is that charge carriers, which are polaronic in nature, create absorption bands within the bandgap. These absorption bands appear to quench the gain generated in the diodes. It is well known from studies on the optical properties of organic materials that charge carriers cause such sub-gab absorption. Also, recent investigations suggest that the losses created by the charge carriers are greater than or equal to the optical gain. Accordingly, the losses are too large in comparison with the optical gain to be neglected.

A structure for an electrically pumped organic laser is described in U.S. Pat. No. 5,881,089 issued to Berggren et al. on Mar. 9, 1999, "Article Comprising an Organic Laser," which is assigned to the present assignee and incorporated herein by reference. The '089 patent describes an electrically-pumped organic laser with a structure that does not use conventional electrical pumping, i.e., pumping by injection of electrons and holes into the diode structure. Drawbacks with using a single cavity diode structure for an organic semiconductor include electrode absorption losses and tradeoffs between carrier transport properties and optical properties. With the device of the '089 patent, electrical power is converted to stimulated optical emission in a unitary device structure; a first region converts an electrical current into incoherent photons, and then the incoherent photons are coupled into a second region that comprises the laser cavity.

As may be appreciated, those involved in the field of lasers and semiconductor devices continue to seek to develop new designs to improve device efficiency and performance and to allow for the use of new materials, such as plastics.

SUMMARY OF THE INVENTION

Summarily described, the invention embraces an article comprising a laser having a structure that is well-suited for achieving electrically-driven lasing action with organic and polymeric LEDs and photoexcited lasers. The laser structure comprises a light-emitting device, e.g., a light emitting diode (LED), a substrate disposed adjacent the LED, and a laser. The light-emitting device comprises a plurality of layers including two spaced-apart conductive layers and a light emissive layer therebetween, such that incoherent radiation of a first wavelength is emitted from the light emissive layer. The radiation is received by the substrate, transmitted within the body thereof to the laser, and then received by the laser. At least one of the LED and the substrate is configured such that the radiation is concentrated as it is guided within the body of the substrate to the laser. The laser then receives the concentrated light to generate a light beam with a relatively low threshold for the laser action.

In one embodiment, the concentration of light along the substrate is achieved with the substrate having a first and a second side, at least two different regions within the body of the substrate, and a light-reflecting interface proximal the junction of the two different regions. The substrate is oriented relative to the light-emitting device that a substantial amount of the electromagnetic radiation is received by one of the two regions at the first side of the substrate, internally reflected at the interface of the two regions, and concentrated within the body of the substrate to the second side. In another embodiment, the light is concentrated with the LED comprising a microcavity LED.

BRIEF DESCRIPTION OF THE DRAWINGS

To illustrate the invention, there is shown in the drawings a form of the invention which is presently preferred, it being understood, however, that the invention is not limited to the precise arrangements and instrumentalities shown.

DETAILED DESCRIPTION OF THE INVENTION

With this invention, a dual cavity device structure is provided that is well-suited for use with organic and polymeric materials. The structure makes it possible to achieve electrically-driven lasing, invoking properties of both organic and polymeric LEDs and photoexcited lasers. The phrase "electrically driven lasing" is used herein instead of "diode lasers" as it is believed to be more appropriate for use in describing the instantly claimed structures.

Figure 1:
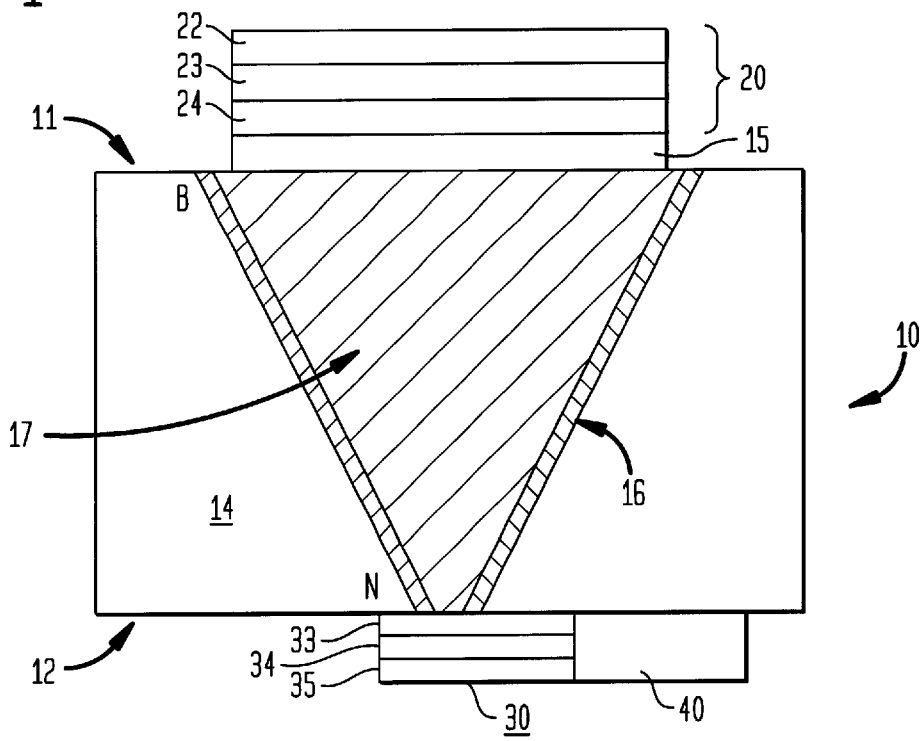
FIG. 1 shows a cross-sectional side view of the inventive laser structure.

More particularly with reference to the figures, FIG. 1 shows a schematic cross-sectional side view of a structure for the laser. In FIG. 1, the laser structure includes a substrate 10 having a first side 11 and a second side 12. An LED 20 is fabricated on the first side 11, and a waveguide laser 30 is fabricated on the second side 12. The laser 30 may be combined with an output coupler 40 to direct the laser emission in a desired direction. The substrate may be fabricated with glass or plastic and is transparent to visible light. A dielectric quarter wave stack layer 15 may be disposed between the substrate 10 and LED 20.

The LED 20 may comprise an organic LED including a first conductor layer 22, a light emissive layer 23, and a conductor layer 24. The conductor layers 22, 24 define a cathode and anode, respectively. The conductor layer functioning as the anode 24 is ordinarily semi-transparent, whereas the cathode layer 22 generally is not. Those skilled in the art will recognize layers 22, 23, 24 as comprising an LED.

Figure 3:
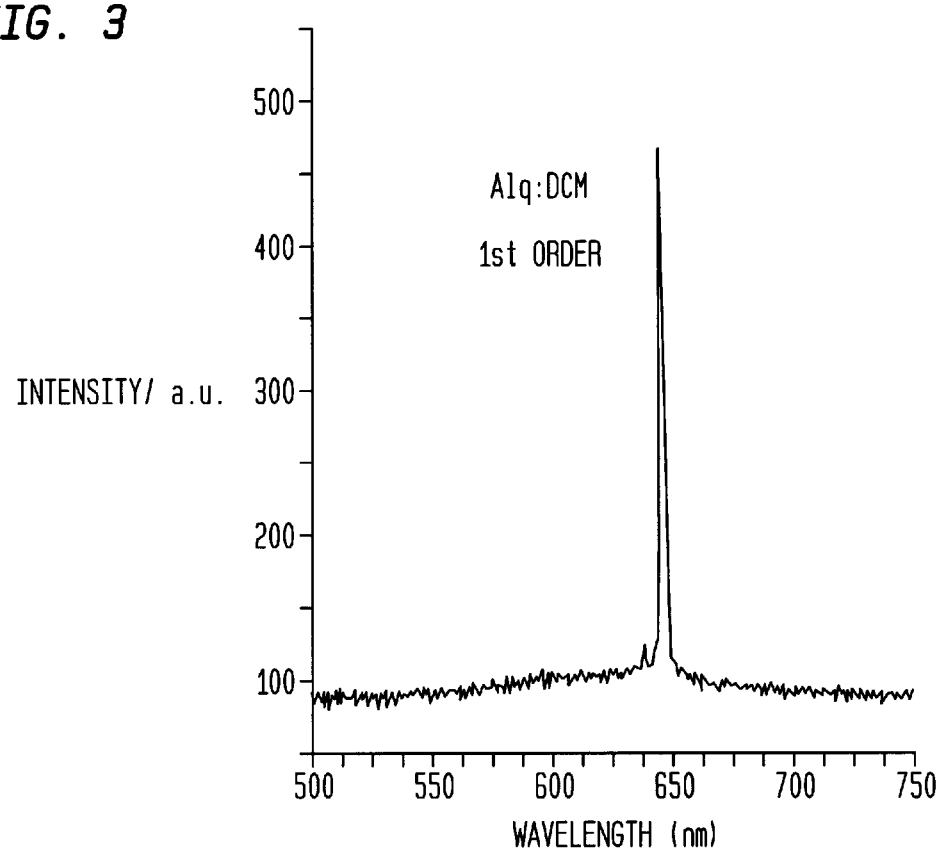
FIG. 3 reflects the electroluminescence spectrum from the inventive laser structure having a nano-molded first order grating structure.

Preferably, the LED is a planar microcavity LED. Such LEDs are described in A. Dodabalapur et al., *"Physics and Applications of Organic Microcavity Light Emitting Diodes,"* J. APPL. PHYS. Vol. 80 (12) (Dec. 15, 1996), at pp. 6954–6964, which is incorporated herein by reference. One of the effects of using a planar microcavity LED is that the directionality of the emitted light may be altered. Thus, more photons will be emitted in the forward direction (i.e., normal to the plane of the layers of the device), than in a non-cavity LED, thus producing a more efficient device. This is illustrated in FIG. 3, comparing the emission spectrum from a cavity and a non-cavity LED.

The materials used in this laser may include those being developed for LED applications. In this way, the output power and operating lifetime that might be expected for the laser can be estimated. A number of suitable organic and polymeric materials that can be used in the LED of the laser are described in A. Dodabalapur, *"Organic Light Emitting Diodes,"* SOLID STATE COMMUNICATIONS, Vol. 102, No. 2–3, pp. 259–267 (1997), which is incorporated herein by reference. Materials or combinations of materials that emit at shorter wavelengths (e.g., 500 nm) are preferred.

The organic and polymeric LEDs can be made to have very high internal and external quantum efficiencies. By "internal quantum efficiency" is meant the fraction of injected electrons that are converted to photons. By "external quantum efficiency" is meant the ratio of photons exiting a device to the electrons injected into the device. External quantum efficiencies of greater than 4 percent have been reported for organic LEDs. This typically corresponds to internal quantum efficiencies of greater than 20percent. These high efficiencies are typically achieved at moderately low current densities (near 1–100 mA/cm$^2$). The quantum efficiency generally falls at high current densities. It is, therefore, desirable to operate these LEDs at relatively low current densities (~1 A/cm$^2$ or less), although higher current densities sometimes may be needed.

Figure 1A:
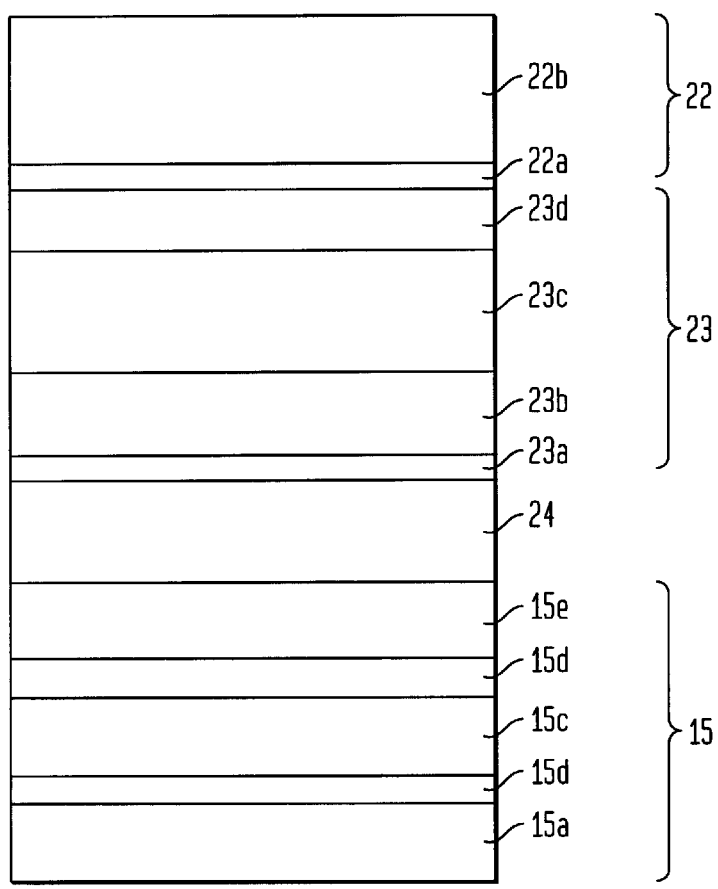
FIG. 1A shows a schematic representation of a preferred structure of a microcavity light emitting diode useful in the inventive laser structure.

A schematic representation of the structure for a preferred microcavity LED for use with the inventive laser is shown in FIG. 1A. The anode 24 preferably comprises an indium tin oxide (ITO) layer having a thickness of about 100 nm. This layer may be sputter deposited on the quarter wave stack layer 15. The quarter wave stack layer 15 may comprise alternating layers of SiO$_2$ and TiO$_2$ sputter deposited over the first side 11 of the substrate. A total of about five to nine such layers may be used (2.5 to 4.5 pairs of layers), with alternating SiO$_2$ and TiO$_2$ layers having thicknesses of about 92 nm and 56 nm, respectively. In FIG. 1A, five layers 15a ... 15e are shown. Si$_x$N$_y$ also advantageously may be used in combination with SiO$_2$ for the quarter wave stack layers.

The light emissive layer 23 preferably comprises four organic layers 23a ... 23d,including a 15 nm layer 23a of copper phthalocyanine, a 50 nm layer 23b of TAD, a 40 nm layer 23c of N,N'-bis (3-methylphenyl)-(1,1'-biphenyl)-4,4'-diamine, and a 20 nm layer 23d of Alq. The cathode preferably comprises a thin (about 1 nm) LiF$_2$ layer 22a and a comparatively thick (about 200 nm) layer 22b of Al that defines the top mirror of the LED. "Alq" is conventional for 8-hydroxyquinolinato aluminum, and "TAD" is conventional for triphenyl/diamine. Of course, it is understood that other materials and combinations of materials may be used to fabricate the LED, the above description being exemplary only.

Radiation emitted from the LED is received by the substrate and transmitted within the body thereof to the laser. According to the invention, the radiation is concentrated as it is guided within the body of the substrate from the first side thereof 11 to the second side 12. The laser then receives the concentrated light to generate a light beam with a relatively low threshold for the laser action. In one embodiment, the light concentration can be achieved with the LED comprising a microcavity LED, as described above. In another embodiment, the light concentration can be achieved with the substrate itself having a light concentration function, e.g., with different regions for internally reflecting, focussing, and/or concentrating the light. In a preferred embodiment, a planar microcavity LED is used in combination with a substrate having the light concentration function.

A light concentration function may be incorporated in the substrate by the substrate 10 having at least two different regions 14, 17 with an interface 16 proximal or defined by their junction for causing internal reflection of radiation as it travels between the first and second sides of the substrate. In one embodiment, this internal reflection is generated by a reflectivity coating at the interface 16 between two regions 14, 17. In another embodiment, the second region comprises a microlens, microlens array, or grating embedded in the substrate for internally reflecting and focussing the radiation. In another embodiment, a reflective interface is generated by a variation in refractive indices of the two regions 14, 17.

The configuration of the two regions is such that the light emitted by the LED is received by one of the two regions (e.g., the "light receiving region 17"), is reflected within that region and concentrated as it travels to the second side before it is incident upon the photoexcited laser 30. The concentration of light may be achieved with at least one microlens or grating comprising the at least second region. Alternatively, the concentration of the light on the laser may be accomplished with the light-receiving region having a substantially circular cross-section with tapered sides. The light-receiving (LR) region 17 (shown with hatching) may be tapered from a broad end B adjacent the first side 11 to a narrower end N adjacent the second side 12. In a preferred embodiment, the LR region defines an axicon or reverse cone configuration, as shown in FIG. 1, and thus may be referred to herein as the "axicon."

Advantageously, the substrate has a thickness of about 2 mm, with the diameter of the LR region 17 at the broad end B being about 0.5 mm and that of the narrow end being about 30 microns. The length or diameter of the LED (as the case may be), is dimensioned so that a significant fraction of the light emitted from the LED is directed to the axicon, where the light will be trapped and concentrated toward the laser 30. Advantageously this is accomplished by the diameter of the LED being substantially equal to the diameter (or length) of the broad end B of the LR region 17. The substrate may be fabricated with glass having a refractive index of about 1.46. Dopants may be used to control the refractive indices of the LR region 17 and the surrounding region 14, as is known in the field. As mentioned, in a preferred embodiment reflection of light is generated by a high-reflectivity coating at the interface 16. However, to achieve reflection of light with refractive index changes, the LR region may be fabricated to have a refractive index of about 1.7.

The laser 30 may comprise cladding layers 33, 35, with a core layer 34 therebetween, as is known in the field and described in the '089 patent, incorporated herein. The laser 30 advantageously comprises a one-dimensional photonic crystal waveguide laser with a grating formed in the active layer or laser substrate, as with a distributed feedback laser or distributed Bragg reflection laser. A one-dimensional distributed feedback laser with a defect is preferred. The grating may be fabricated by nanomolding a resonator structure and applying a film of Alq doped with about 0.5 to 5.0 weight percent of the laser dye DCMIII to the resonator, as described in U.S. patent application Ser. No. 09/322,471, filed May 28, 1999, which is assigned to the present assignee and incorporated herein by reference. As discussed in the '471 application, new micro-printing techniques are being developed, and these may be applied to form the waveguide grating. See also J. A. Rogers et al., "*Using Printing and Molding Techniques to Produce Distributed Feedback and Bragg Reflector Resonators for Plastic Lasers,*" J. APPL. PHYSICS, Vol. 73, No. 13 (1998), at pp. 1766–1767, incorporated herein by reference.

The laser grating preferably is one-dimensional and has a periodicity of about 182 nm. A defect may be introduced into the grating (e.g., the one-dimensional photonic crystal) by forming at least one of the grooves defining the grating with a different width than other grooves. Advantageously, the grooves have a depth of about 50 nm and a width of about 91 nm. The defect may comprise a groove having a width of about 182 nm. The overall dimensions of the laser grating should be greater than about 10 microns-by-10 microns to ensure that there is adequate coupling between the grating and the electromagnetic field produced by the LED and substrate. Lattice-matching of the layers forming the laser device to the substrate is not necessary, presenting an advantage over inorganic semiconductor lasers.

The output coupler 40 preferably is a two-dimensional slab photonic crystal without a complete bandgap. In this respect, the laser structure of this invention presents a unique application for a two-dimensional photonic crystal. When a first order one-dimensional grating (with or without a defect) is used for the laser, the output coupler may comprise a second order grating with twice the periodicity as the first order grating. This configuration results in phase-matching conditions to cause a significant fraction (e.g., greater than about 50 percent) of the laser emission generated in the plane of the waveguide to be diffractively coupled out of the plane at right angles. Consequently, the laser becomes surface emitting.

The laser 30 and coupler 40 may comprise part of the same waveguide and be fabricated simultaneously. To form the grating of the laser or the output coupler, a nano-molding printing technique may be applied (e.g., as noted above). A layer of pre-polymer of polyurethane can be used with a mold placed in contact therewith to imprint the features of the mold on the prepolymer. The relief pattern for the output coupler advantageously comprises a triangular lattice of holes. A preferred lattice is one having a lattice constant of about 433 nm in which each hole has a diameter of about 160 nm. The depth of the holes may be about 50 nm.

The laser gain medium may comprise combinations of small molecules and polymers including conjugated polymers. For example, about 250 nm of 10% conjugated poly(phenylene vinylene) (PPV7) by weight may be diluted or dispersed in a matrix of polystyrene or 2-(4-biphenylyl)-5-(4-tert-butylphenyl)-1,3,4-oxadiazole (PBD). Doped small molecules such as Alq or 2-napthyl-4,5-bis(4-methoxyphenyl)-1,3 oxazole (NAPOXA) also may be used. Suitable compositions and mixtures for use as the gain medium are further described in A. Dodabalapur, "*Resonators and Materials for Organic Lasers Based on Energy Transfer,*" EEE J.OF SELECTED TOPICS IN QUAN. ELEC., Vol. 4, No. 1 (January/February 1998), which is incorporated herein by reference.

In operation, light is emitted from the LED 20 to the LR region 17 of the substrate 10. Due to the reflective periphery of the axicon, light is confined within the axicon 17. Preferably, the LED is dimensioned such that a large fraction (e.g., greater than about 25 percent) of the photons generated by the LED are confined to the axicon region of the substrate. Use of a planar cavity LED is preferred to a non-cavity LED as with the former a greater fraction of the photons emitted from the LED will become trapped in the axicon. This improves the efficiency of the device and leads to lower threshold powers for the laser (e.g., less than about 150 W/cm$^2$ or even 100 W/cm$^2$). As light approaches the narrow end of the axicon, its intensity increases.

Figure 2:
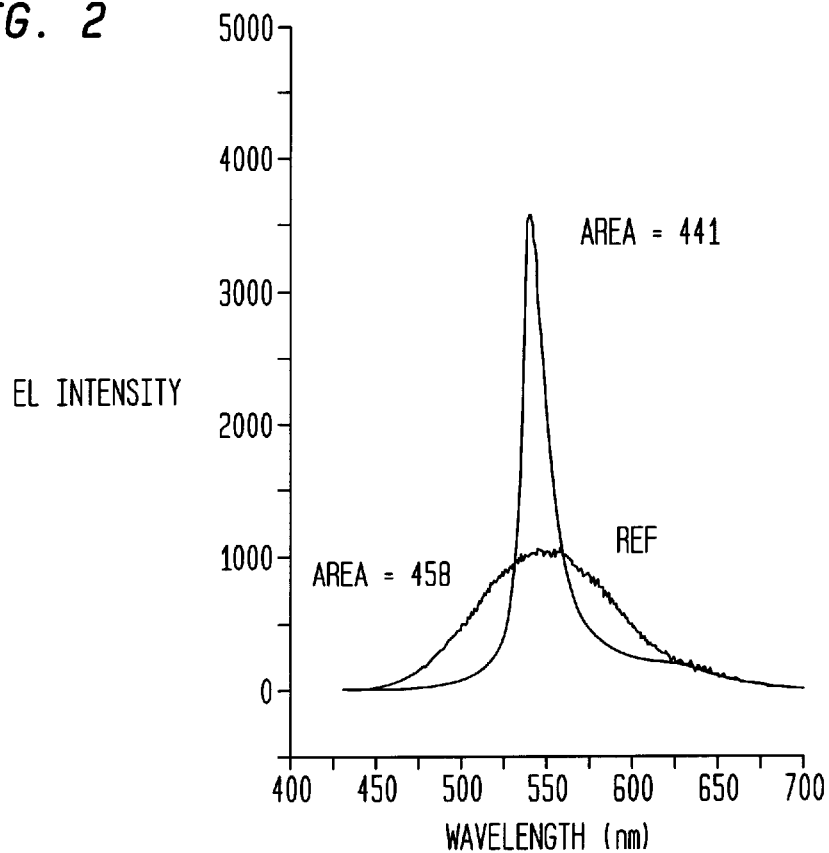
FIG. 2 reflects the electroluminescence spectrum from a cavity LED preferred for use with the invention as compared with a non-cavity LED.

The light impinging on the laser 30 at the narrow end of the axicon photoexcites the gain medium in the photonic crystal laser 30. When the pump power is greater than threshold, laser action is generated. The laser then emits light in the plane of the waveguide which may be coupled by the output coupler 40 out of the plane at a desired angle. Preferably, the laser has a low threshold pump power and exhibits low loss. The coupler preferably generates a collimated beam. FIG. 2 reflects the electro-luminescence spectrum from a cavity LED preferred for use with the invention as compared with a non-cavity LED. FIG. 3 reflects the electroluminescence spectrum from the inventive laser structure having a nano-molded first order grating structure. The gain media of the laser of FIG. 3 comprises a patterned layer of Alq doped with about 1% DCM (a laser dye available, for instance, from Exciton, Inc., Dayton, Ohio). As can be seen from FIGS. 2–3, the light injected into the substrate from the LED is converted to photons of longer wavelength. With these materials, threshold pump powers in the 85–150 W/cm$^2$ range may be achieved.

The present invention may be embodied in other specific forms without departing from the spirit or essential attributes therefor. Accordingly, reference should be made to appended claims, rather than to the foregoing specification, as indicating the scope of the invention. For example, although this laser structure is discussed primarily with regard to use of organic lasers, the structure could be employed for other gain media as well.

The invention claimed is:

1. An article comprising a laser structure for providing a source of electromagnetic radiation, the laser structure comprising:

a light-emitting device comprising a plurality of layers including two spaced-apart conductive layers and a light emissive layer therebetween such that incoherent radiation of a first wavelength is emitted from the light emissive device, a substrate disposed adjacent the light-emitting device and having a first and a second side, the substrate being so oriented relative to the light-emitting device that incoherent electromagnetic radiation of the first wavelength emitted from the light-emitting device is received by the substrate at the first side and guided within the body of the substrate to the second side, wherein the substrate is configured such that the radiation is concentrated as it is guided within the body of the substrate from the first side to the second side, and a laser comprising a first and a second cladding region with a core region therebetween, the laser disposed such that the radiation guided to the second side of the substrate is received by the laser, the core region comprising a layer of material selected to absorb the incoherent radiation of the first wavelength and to emit coherent electromagnetic radiation of second wavelength, longer than the first wavelength, in response to the absorbed incoherent electromagnetic radiation;

the substrate configured to concentrate the radiation by the substrate comprising at least a first and a second region with a reflective interface proximal the junction of the first and second regions for internally reflecting light within the first region, the substrate being so oriented relative to the light-emitting device that a substantial amount of the incoherent electromagnetic radiation of the first wavelength emitted from the light-emitting device is received by the first region at the first side of the substrate, wherein the radiation is internally reflected at the interface to be substantially confined within the first region and is guided within the first region to the second side of the substrate.

2. The article of claim 1 in which the light emitting device comprises a microcavity LED.

3. The article of claim 1 in which the reflective interface comprises a high-reflectively coating disposed at the junction of the first and second regions.

4. The article of claim 1 in which the reflective interface comprises a refractive index difference at the junction of the first and second regions, the first region having a higher refractive index than the second region.

5. The article of claim 1 in which the second region comprises at least one microlens or grating for providing the reflective interface and concentrating the radiation.

6. The article of claim 1, in which the first region has an axicon configuration having an axicon broad end and a narrow end, wherein the broad end is aligned with the first side and the narrow end is aligned with the second side of the substrate.

7. The article of claim 1, in which the light emissive layer comprises at least one organic material.

8. The article of claim 7, in which at least one organic material is selected from Alq, TAD, copper phthalocyanine, and diamine including N,N'-bis(3-methylphenyl)-(1, 1'biphenyl)-4,4'-diamine.

9. The article of claim 1, further comprising a quarter wave stack layer disposed between the light-emitting device and the substrate.

10. The article of claim 1 in which the substrate is fabricated with plastic or glass.

11. The article of claim 1, in which the laser comprises a photonic crystal waveguide laser.

12. The article of claim 11, in which the laser includes a distributed feedback grating selected to facilitate emission of electromagnetic radiation of the second wavelength.

13. The article of claim 11, in which the laser includes two spaced-apart distributed Bragg reflectors selected to facilitate emission of electromagnetic radiation of the second wavelength.

14. The article of claim 1, further comprising an output coupler for guiding the radiation of the second wavelength emitted from the laser in a desired direction.

15. The article of claim 14, in which the output coupler comprises a two-dimensional photonic crystal.

16. The article of claim 1 in which the core region of the laser comprises at least one organic material.

17. The article of claim 16, in which the at least one organic material is selected from conjugated poly(phenylene vinylene), polystyrene or 2-(4-biphenylyl)-5-(4-tertbutylphenyl)-1,3,4-oxadiazole, Alq and 2-napthyl-4,5-bis(4-methoxyphenyl)-1,3 oxazole (NAPOXA).

18. An article comprising a laser structure for providing a source of electromagnetic radiation, the laser structure comprising a substantially planar microcavity LED for emitting incoherent radiation of a first wavelength, a substrate disposed adjacent the microcavity LED and having a first and a second side, the substrate comprising a first light-receiving region and a second surrounding region with a reflectivity coating disposed at the junction of the first and second regions to internally reflect light within the first region, the first and second regions configured to define an axicon having a broad end at the first side and a narrow end at the second side, wherein the incoherent electromagnetic radiation of the first wavelength emitted from the microcavity LED is received by the first region at the broad end, internally reflected in the first region and concentrated as it is guided within the body of the first region to the second side of the substrate, an optical waveguide laser comprising a first and a second cladding region with a core region therebetween fabricated with an organic material, the laser disposed such that at least some of the radiation guided to the second side of the substrate is received by the laser, the core region comprising a layer of material selected to absorb the incoherent radiation of the first wavelength and to emit coherent electromagnetic radiation of a second wavelength, longer than the first wavelength, in response to the absorbed incoherent electromagnetic radiation; and an output coupler comprising a two-dimensional photonic crystal for guiding radiation of the second wavelength emitted from the laser in a desired direction, the output coupler and waveguide laser being integrated on one waveguide.

* * * * *